(12) United States Patent
Park et al.

(10) Patent No.: US 9,117,938 B2
(45) Date of Patent: Aug. 25, 2015

(54) SEMICONDUCTOR DEVICES WITH THROUGH VIA ELECTRODES, METHODS OF FABRICATING THE SAME, MEMORY CARDS INCLUDING THE SAME, AND ELECTRONIC SYSTEMS INCLUDING THE SAME

(71) Applicant: SK HYNIX INC., Icheon (KR)

(72) Inventors: Jin Woo Park, Gwangju (KR); Sang Gyu Lee, Seould (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/180,327

(22) Filed: Feb. 13, 2014

(65) Prior Publication Data
US 2015/0048519 A1 Feb. 19, 2015

(30) Foreign Application Priority Data
Aug. 16, 2013 (KR) ........................ 10-2013-0097294

(51) Int. Cl.
*H01L 23/52* (2006.01)
*H01L 23/00* (2006.01)
(Continued)

(52) U.S. Cl.
CPC .......... *H01L 24/97* (2013.01); *H01L 21/76897* (2013.01); *H01L 21/784* (2013.01); *H01L 23/3171* (2013.01); *H01L 23/481* (2013.01); *H01L 24/13* (2013.01); *H01L 24/94* (2013.01); *H01L 25/0657* (2013.01); *H01L 23/3107* (2013.01); *H01L 24/05* (2013.01); *H01L 24/14* (2013.01); *H01L 24/16* (2013.01); *H01L 24/32* (2013.01); *H01L 24/73* (2013.01); *H01L 24/81* (2013.01); *H01L 24/92* (2013.01); *H01L 25/18* (2013.01); *H01L 2224/0401* (2013.01); *H01L 2224/05009* (2013.01); *H01L 2224/05605* (2013.01); *H01L 2224/05609* (2013.01); *H01L 2224/05611* (2013.01); *H01L 2224/05613* (2013.01); *H01L 2224/05616* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/131* (2013.01); *H01L 2224/13022* (2013.01); *H01L 2224/13023* (2013.01); *H01L 2224/13025* (2013.01); *H01L 2224/13082* (2013.01); *H01L 2224/13083* (2013.01); *H01L 2224/13144* (2013.01); *H01L 2224/13147* (2013.01); *H01L 2224/13155* (2013.01); *H01L 2224/14181* (2013.01); *H01L 2224/16146* (2013.01); *H01L 2224/16148* (2013.01); *H01L 2224/16235* (2013.01); *H01L 2224/16238* (2013.01); *H01L 2224/32145* (2013.01); *H01L 2224/32225* (2013.01); *H01L 2224/73204* (2013.01);
(Continued)

(58) Field of Classification Search
USPC ................................. 257/777, 621, E25.006
See application file for complete search history.

(56) References Cited

U.S. PATENT DOCUMENTS

| 8,110,930 B2 * | 2/2012 | Periaman et al. ............. 257/778 |
| 2006/0006501 A1 * | 1/2006 | Kawano ........................ 257/625 |

FOREIGN PATENT DOCUMENTS

| KR | 10-2009-0123659 A | 12/2009 |
| KR | 10-2011-0078399 A | 7/2011 |

*Primary Examiner* — Jasmine Clark

(57) ABSTRACT

A semiconductor device includes a via electrode penetrating a substrate and a back-side molding layer covering a back-side surface of the substrate. The back-side molding layer contacts a sidewall of a back-side end portion of the via electrode, which is a portion of the via electrode that protrudes from the back-side surface of the substrate.

11 Claims, 7 Drawing Sheets

(51) Int. Cl.
  *H01L 21/768* (2006.01)
  *H01L 23/48* (2006.01)
  *H01L 25/065* (2006.01)
  *H01L 21/784* (2006.01)
  *H01L 23/31* (2006.01)
  *H01L 25/18* (2006.01)
(52) U.S. Cl.
  CPC ........... *H01L 2224/81193* (2013.01); *H01L 2224/92225* (2013.01); *H01L 2224/94* (2013.01); *H01L 2225/06513* (2013.01); *H01L 2225/06517* (2013.01); *H01L 2225/06544* (2013.01); *H01L 2225/06548* (2013.01); *H01L 2225/06565* (2013.01); *H01L 2225/06568* (2013.01); *H01L 2924/1431* (2013.01); *H01L 2924/1436* (2013.01); *H01L 2924/1437* (2013.01); *H01L 2924/1438* (2013.01); *H01L 2924/1441* (2013.01); *H01L 2924/157* (2013.01); *H01L 2924/15311* (2013.01); *H01L 2924/18161* (2013.01)

SEMICONDUCTOR DEVICES WITH THROUGH VIA ELECTRODES, METHODS OF FABRICATING THE SAME, MEMORY CARDS INCLUDING THE SAME, AND ELECTRONIC SYSTEMS INCLUDING THE SAME

CROSS-REFERENCE TO RELATED APPLICATION

The present application claims priority under 35 U.S.C 119(a) to Korean Application No. 10-2013-0097294, filed on Aug. 16, 2013, in the Korean intellectual property Office, which is incorporated herein by reference in its entirety as set forth in full.

BACKGROUND

1. Technical Field

Embodiments of the present disclosure relate to semiconductor devices and, more particularly, to semiconductor devices with through via electrodes, methods of fabricating the same, memory cards including the same and electronic systems including the same.

2. Related Art

Semiconductor devices employed in electronic systems may include various electronic circuit elements. Electronic circuit elements may be integrated in and/or on a semiconductor substrate to form a semiconductor device (also, referred to as a semiconductor chip or a semiconductor die). Semiconductor memory chips may also be employed in electronic systems. Before semiconductor devices, including semiconductor memory chips, are employed in an electronic system, the semiconductor devices may be encapsulated to form a package. These semiconductor packages may be employed in the electronic systems, for example, computers, mobile systems or data storage media.

As electronic systems such as mobile systems, which include smart phones, become lighter and smaller, the semiconductor packages employed in the mobile systems are increasingly scaled down. Thus, stack packages, each of which includes a plurality of stacked semiconductor chips, are increasingly in demand with the development of multi-functional and high capacity semiconductor packages. In this regard, there have been efforts to reduce the thickness and the size of the stack packages to provide thin and small stack packages. In addition, through silicon via (TSV) electrodes penetrating the semiconductor chips have been proposed to realize interconnection structures that electrically couple the semiconductor chips to an external device.

SUMMARY

Various embodiments are directed to semiconductor devices with through via electrodes, methods of fabricating the same, memory cards including the same, and electronic systems including the same.

According to some embodiments, a semiconductor device includes a first substrate, a first conductive via electrode extending from a front side surface of the first substrate toward a backside surface of the first substrate to penetrate the first substrate, and a first backside molding layer covering the backside surface of the first substrate and contacting sidewall of a backside end portion of the first conductive via electrode. The first backside molding layer exposes a top surface of the backside end portion of the first conductive via electrode.

According to further embodiments, a semiconductor device includes a first chip, a second chip, and a package molding layer. The first chip includes a first substrate, a first conductive via electrode extending from a front side surface of the first substrate toward a backside surface of the first substrate to penetrate the first substrate, and a first backside molding layer covering the backside surface of the first substrate and contacting a sidewall of a backside end portion of the first conductive via electrode. The second chip includes a second substrate, a second conductive via electrode extending from a front side surface of the second substrate toward a backside surface of the second substrate to penetrate the second substrate, and a second backside molding layer covering the backside surface of the second substrate and contacting a sidewall of a backside end portion of the second conductive via electrode. The second chip is stacked on the first chip such that the second conductive via electrode is electrically connected to the first conductive via electrode. The package molding layer covers sidewalls of the first and second chips and contacts the first and second backside molding layers.

According to further embodiments, a method of fabricating a semiconductor device includes forming a conductive via electrode extending from a front side surface of the substrate toward a backside surface of the substrate to penetrate the substrate. The conductive via electrode is formed to include a backside end portion that protrudes from the backside surface of the substrate. An initial backside molding layer is formed on the backside surface of the substrate to cover the protruded backside end portion of the conductive via electrode. The initial backside molding layer is ground to form a backside molding layer exposing the backside end portion of the conductive via electrode.

According to further embodiments, a memory card includes a semiconductor device. The semiconductor device includes a first substrate, a first conductive via electrode extending from a front side surface of the first substrate toward a backside surface of the first substrate to penetrate the first substrate, and a first backside molding layer covering the backside surface of the first substrate and contacting sidewall of a backside end portion of the first conductive via electrode. The first backside molding layer exposes a top surface of the backside end portion of the first conductive via electrode.

According to further embodiments, a memory card includes a semiconductor device. The semiconductor device includes a first chip, a second chip, and a package molding layer. The first chip includes a first substrate, a first conductive via electrode extending from a front side surface of the first substrate toward a backside surface of the first substrate to penetrate the first substrate, and a first backside molding layer covering the backside surface of the first substrate and contacting a sidewall of a backside end portion of the first conductive via electrode. The second chip includes a second substrate, a second conductive via electrode extending from a front side surface of the second substrate toward a backside surface of the second substrate to penetrate the second substrate, and a second backside molding layer covering the backside surface of the second substrate and contacting a sidewall of a backside end portion of the second conductive via electrode. The second chip is stacked on the first chip such that the second conductive via electrode is electrically connected to the first conductive via electrode. The package molding layer covers sidewalls of the first and second chips and contacts the first and second backside molding layers.

According to further embodiments, an electronic system includes a semiconductor device. The semiconductor device includes a first substrate, a first conductive via electrode extending from a front side surface of the first substrate toward a backside surface of the first substrate to penetrate the first substrate, and a first backside molding layer covering the backside surface of the first substrate and contacting sidewall of a backside end portion of the first conductive via electrode. The first backside molding layer exposes a top surface of the backside end portion of the first conductive via electrode.

According to further embodiments, an electronic system includes a semiconductor device. The semiconductor device includes a first chip, a second chip, and a package molding layer. The first chip includes a first substrate, a first conductive via electrode extending from a front side surface of the first substrate toward a backside surface of the first substrate to penetrate the first substrate, and a first backside molding layer covering the backside surface of the first substrate and contacting a sidewall of a backside end portion of the first conductive via electrode. The second chip includes a second substrate, a second conductive via electrode extending from a front side surface of the second substrate toward a backside surface of the second substrate to penetrate the second substrate, and a second backside molding layer covering the backside surface of the second substrate and contacting a sidewall of a backside end portion of the second conductive via electrode. The second chip is stacked on the first chip such that the second conductive via electrode is electrically connected to the first conductive via electrode. The package molding layer covers sidewalls of the first and second chips and contacts the first and second backside molding layers.

BRIEF DESCRIPTION OF THE DRAWINGS

Embodiments of the present invention will become more apparent in view of the attached drawings and accompanying detailed description, in which.

DETAILED DESCRIPTION OF EMBODIMENTS

Figure 1:
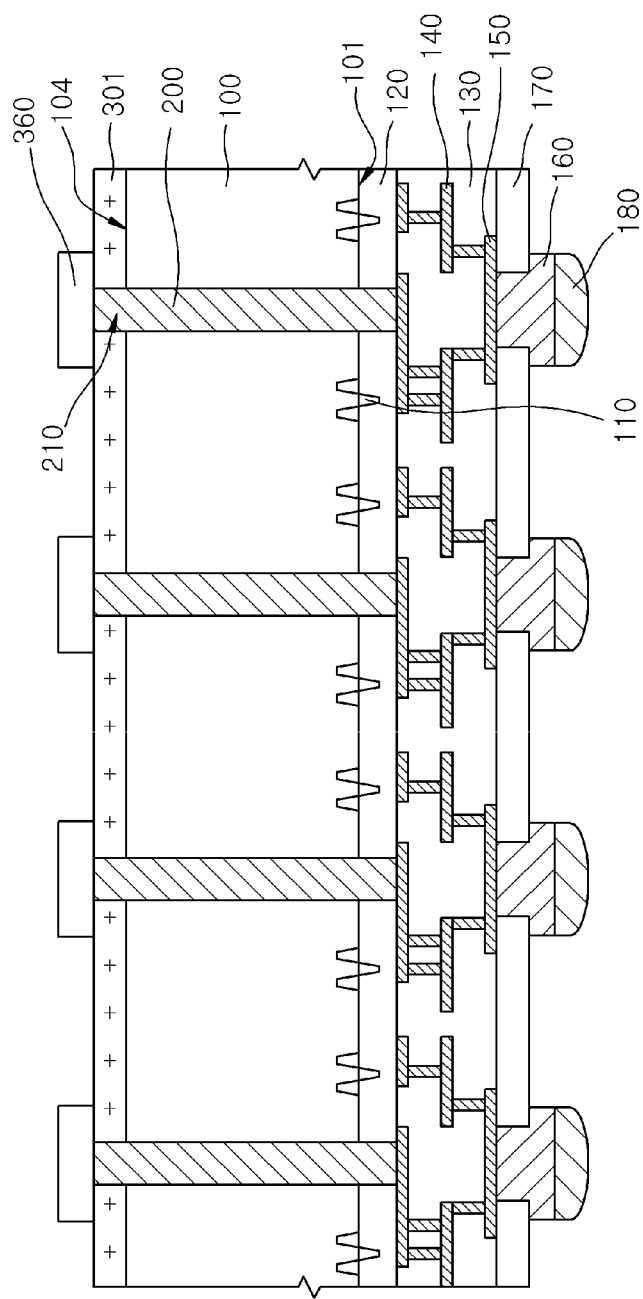
FIG. 1 is a cross-sectional view illustrating a semiconductor device according to an embodiment of the present invention.

Embodiments of the present invention provide semiconductor devices including via electrodes and methods of fabricating the same. A semiconductor device according to an embodiment may include a back-side molding layer disposed on a back-side surface of a semiconductor substrate, which is exposed together with back-side end portions of via electrodes penetrating the semiconductor substrate. Thus, the back-side molding layer may prevent the back-side end portions of the via electrodes on the back side of the substrate from being damaged. The back-side molding layer may include substantially the same material as a package molding layer that protects sidewalls of a semiconductor chip including the semiconductor substrate. Accordingly, the back-side molding layer may prevent the package molding layer from peeling off from the semiconductor chip. As a result, a package failure is avoided.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention.

It will also be understood that when an element is referred to as being "on", "above", "below", or "under" another element, it can be directly "on", "above", "below", or "under" the other element, respectively, or intervening elements may also be present. Accordingly, the terms such as "on", "above", "below", or "under" which are used herein are for the purpose of describing particular embodiments only and are not intended to be limiting.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a similar fashion. The semiconductor substrate may have an active layer corresponding to a region where transistors and internal interconnection lines constituting electronic circuits are integrated, and semiconductor chips may be obtained by separating the semiconductor substrate into a plurality of pieces.

The semiconductor chips may correspond to memory chips or logic chips. The memory chips may include dynamic random access memory (DRAM) circuits, static random access memory (SRAM) circuits, flash memory circuits, magnetic random access memory (MRAM) circuits, resistive random access memory (ReRAM) circuits, ferroelectric random access memory (FeRAM) circuits, or phase change random access memory (PCRAM) circuits, which are integrated on and/or in the semiconductor substrate. The logic chips may include logic circuits which are integrated on and/or in the semiconductor substrate. In some cases, the term "semiconductor substrate" used herein may be construed as a semiconductor chip or a semiconductor die in which integrated circuits are formed.

FIG. 1 illustrates a semiconductor device according to an embodiment. The semiconductor device includes via electrodes 200 that extend from a front-side surface 101 of a semiconductor substrate 100 toward a back-side surface 104 of the semiconductor substrate 100. That is, the via electrodes 200 may vertically penetrate the semiconductor substrate 100. The semiconductor substrate 100 may be a silicon substrate and may have a wafer form or a separate chip form. The front-side surface 101 of the semiconductor substrate 100 may correspond to a surface of an active layer where integrated circuits are formed. The back-side surface 104 of the semiconductor substrate 100 may be a surface opposite to the front-side surface 101 with respect to the body of the semiconductor substrate 100. Circuit elements such as transistors 110 constituting an integrated circuit may be formed in and on the active layer, and a dielectric layer 130 and internal interconnection structures 140 formed in the dielectric layer 130 may be disposed over the front-side surface 101.

Each of the internal interconnection structures 140 may include an interconnection line and a connection via to provide an electrical connection structure. The internal interconnection structures 140 electrically couple the via electrodes 200 to corresponding connection pads 150. First conductive bumps 160 are disposed on corresponding connection pads 150 to act as outer connection terminals for connecting the semiconductor device to an external device. Thus, the first conductive bumps 160 are electrically coupled to the corresponding via electrodes 200.

A passivation layer 170 is disposed on a surface of the dielectric layer 130 to expose the connection pads 150. As illustrated in FIG. 1, the via electrodes 200 are electrically coupled to the first conductive bumps 160 through the internal interconnection structures 140 and the connection pads 150.

In another embodiment, the via electrodes 200 are directly connected to the first conductive bumps 160, or each via electrode 200 and its corresponding first conductive bump 160 may constitute a unitary body. The first conductive bumps 160 may be formed of a metal material such as a copper (Cu) material.

Conductive adhesive layers 180 are disposed on corresponding first conductive bumps 160. The conductive adhesive layers 180 may be provided to improve an adhesive strength between the first conductive bumps 160 and external connection terminals. The conductive adhesive layers 180 may be formed of a solder layer. An interfacial layer may be disposed between the first conductive bumps 160 and the conductive adhesive layers 180. The interfacial layer may include a wetting layer such as a nickel layer or an oxidation resistant material layer such as a gold layer.

The via electrodes 200 may correspond to through via electrodes such as through silicon vias (TSVs) or through electrodes. The via electrodes 200 may be formed of a metal material. The via electrodes 200 may be formed of a gallium (Ga) material, an indium (In) material, a tin (Sn) material, a silver (Ag) material, a copper (Cu) material, a mercury (Hg) material, a bismuth (Bi) material, a lead (Pb) material, a gold (Au) material, a zinc (Zn) material, an aluminum (Al) material, or an alloy thereof.

Back-side end portions 210 of the via electrodes 200 may protrude from the back-side surface 104 of the semiconductor substrate 100. In an embodiment, the back-side end portions 210 of the via electrodes 200 penetrate a back-side molding layer 301 that is formed on the back-side surface 104 to protect the back-side surface 104 of the semiconductor substrate 100. That is, the back-side molding layer 301 may surround sidewalls of the back-side end portions 210 of the via electrodes 200 to electrically insulate the back-side end portions 210 from each other.

The back-side molding layer 301 may be formed by performing a back-side molding process for covering the back-side surface 104 of the semiconductor substrate 100 with an epoxy molding compound (EMC) material. Thus, the back-side molding layer 301 can be formed at a low cost. Furthermore, the back-side molding layer 301 may be more solid and harder than an oxide layer or a polyimide layer that is used as a back-side passivation layer. Thus, the back-side molding layer 301 may prevent the back-side end portions 210 of the via electrodes 200 from being deformed during a grinding process for exposing the back-side end portions 210 of the via electrodes 200.

The back-side end portions 210 of the via electrodes 200 are covered with second conductive bumps 360 acting as outer connection terminals. The second conductive bumps 360 may be formed of a metal material such as a copper material. The first conductive bumps 160 disposed on the front-side surface 101 of the semiconductor substrate 100 are electrically coupled to the second conductive bumps 360 disposed on the back-side surface 104 of the semiconductor substrate 100 through the via electrodes 200.

FIGS. 2 to 5 are cross-sectional views illustrating a method of fabricating the semiconductor device shown in FIG. 1 according to an embodiment of the present invention.

Figure 2:
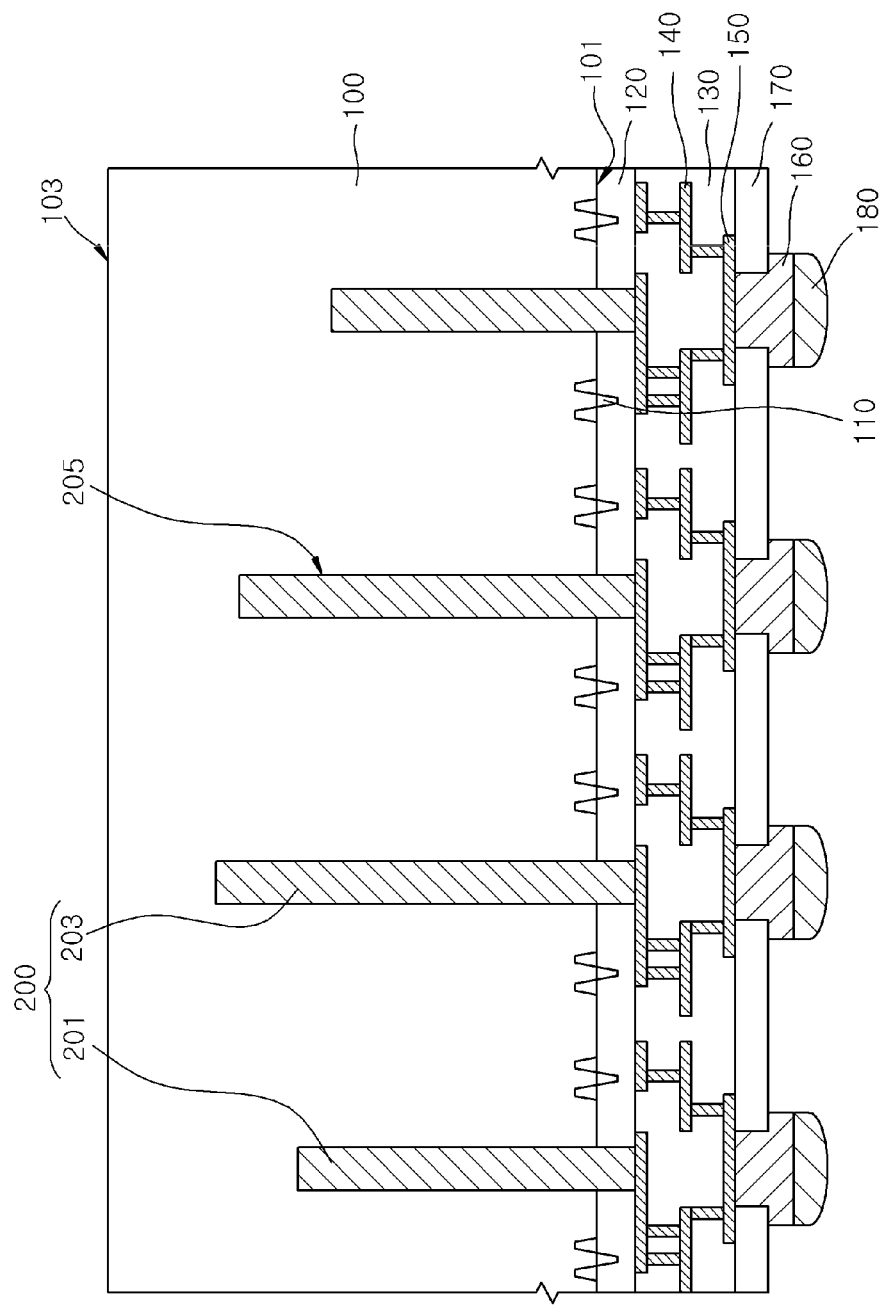
FIGS. 2 to 5 are cross-sectional views illustrating a method of fabricating a semiconductor device according to an embodiment of the present invention.

Referring to FIG. 2, a plurality of transistors 110 are formed in an active layer which is adjacent to a front-side surface 101 of a semiconductor substrate 100. An interlayer insulation layer 120 is formed on the front-side surface 101 of the semiconductor substrate 100 to cover the transistors 110. After that, via electrodes 200 are formed to penetrate the interlayer insulation layer 120 and to extend into the semiconductor substrate 100. That is, the via electrodes 200 are formed to extend from the front-side surface 101 of the semiconductor substrate 100 toward an initial back-side surface 103 of the semiconductor substrate 100.

The via electrodes 200 may be formed using a process of forming through silicon vias (TSVs) at a wafer level. In particular, the interlayer insulation layer 120 and the semiconductor substrate 100 are etched to form via holes 205 that have openings at the front-side surface 101 and extend toward the initial back-side surface 103. A conductive material such as a copper material then fills the via holes 205. As a result, the via electrodes 200 are formed in each one of the via holes 205.

The via holes 205 may be formed to have different depths from each other depending on their locations in the semiconductor substrate 100. Thus, the via electrodes 200 may also be formed to have different vertical lengths according to their locations in the semiconductor substrate 100. In FIG. 2, the via electrodes 200 include relatively short via electrodes 201 and relatively long via electrodes 203. Although not shown in the drawings, an insulation liner may be formed between the via electrodes 200 and the semiconductor substrate 100.

Subsequently, a dielectric layer 130 and internal interconnection structures 140 disposed in the dielectric layer 130 are formed on the interlayer insulation layer 120 and the via electrodes 200. Connection pads 150 are formed in an upper portion of the dielectric layer 130 to be coupled to corresponding internal interconnection structures 140.

A passivation layer 170 for exposing part of the connection pads 150 is formed on the dielectric layer 130 and the connection pads 150. After that, first conductive bumps 160 are formed on each of the exposed connection pads 150. Conductive adhesive layers 180 are formed on each of the first conductive bumps 160. The processes described above may be performed while the semiconductor substrate 100 is oriented such that the initial back-side surface 103 is provided as the bottom surface of the substrate 100 and the front-side surface 101 is provided as the top surface of the substrate 100. After forming the conductive adhesive layers 180 over the semiconductor substrate 100, the semiconductor substrate 100 is turned over so that the initial back-side surface 103 of the semiconductor substrate 100 is provided as the top of the substrate 100 and the front-side surface 101 is provided as the bottom surface of the substrate 100, as shown in FIG. 2.

Figure 3:
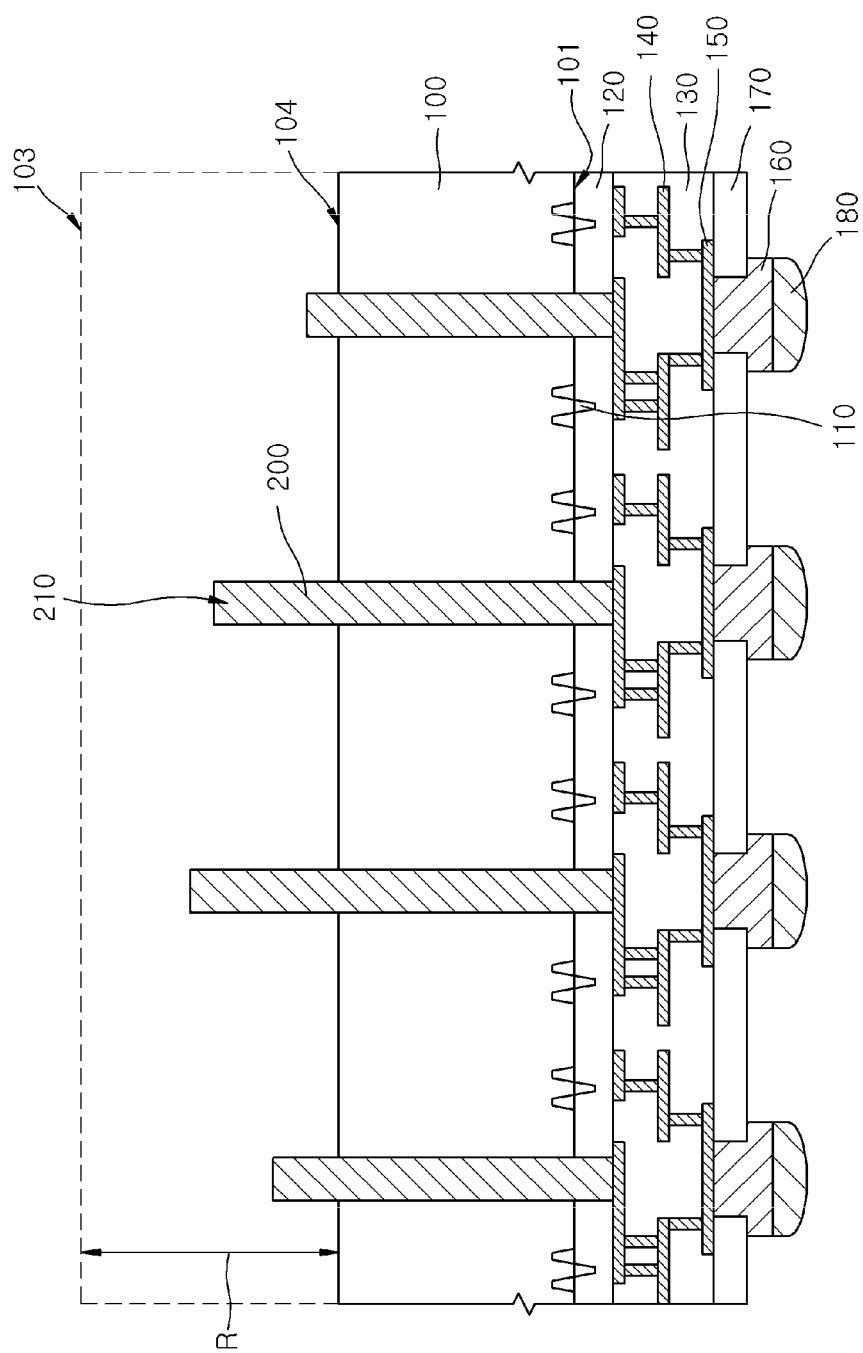

Referring to FIG. 3, a process for removing a portion of the back side of the semiconductor substrate 100 by a predetermined thickness R is performed on the initial back-side surface 103 to expose back-side end portions 210 of the via electrodes 200. The process for removing the portion of the back side of the semiconductor substrate 100 may be a dry etch process such that the back-side end portions 210 of the via electrodes 200 protrude from a back-side surface 104 of the etched semiconductor substrate 100. In an embodiment, since the via electrodes 200 are formed to have different vertical lengths depending on their locations in the semiconductor substrate 100, lengths of the back-side end portions 210 protruding from the back-side surface 104 may also be different from each other.

Figure 4:
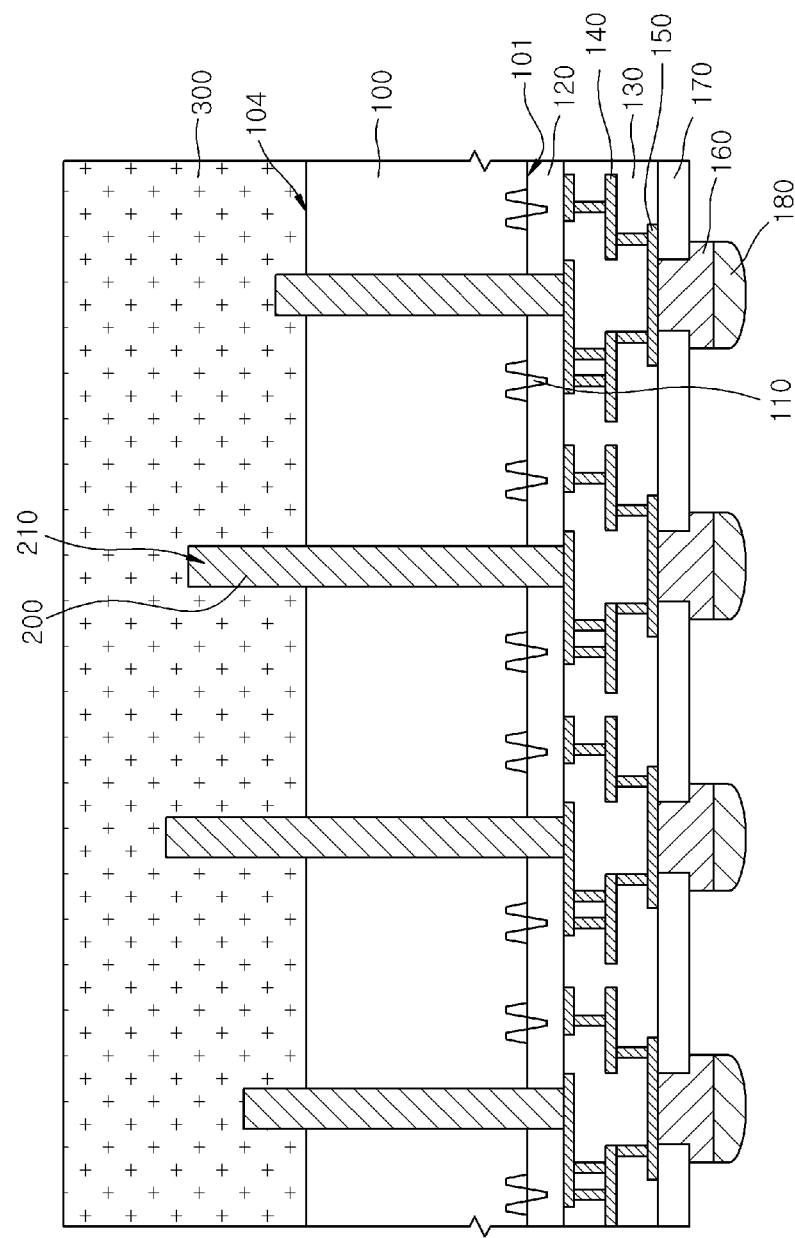

Referring to FIG. 4, an initial back-side molding layer 300 is formed to cover the back-side surface 104 of the semiconductor substrate 100 and the back-side end portions 210 of the via electrodes 200. The initial back-side molding layer 300 may be formed at a wafer level using a molding apparatus. The initial back-side molding layer 300 may be formed of an epoxy molding compound (EMC) material. The initial back-side molding layer 300 may be formed to have a sufficient thickness to cover the back-side end portions 210 of the via electrodes 200.

In an embodiment, the initial back-side molding layer 300 is formed to have a thickness of about 100 micrometers to about 150 micrometers. Since the initial back-side molding layer 300 is formed using the molding apparatus, a surface of the initial back-side molding layer 300 may have a flat, even profile rather than an uneven profile. The initial back-side molding layer 300 may be formed of an EMC material which is relatively harder than an oxide layer or a polyimide layer. Thus, the initial back-side molding layer 300 may reinforce the original shapes of the top surfaces of the back-side end portions 210' (see FIG. 5) of the via electrodes 200 even though the initial back-side molding layer 300 and the vertical length of the back-side end portions 210 are ground in a subsequent process. That is, the initial back-side molding layer 300 may prevent the back-side end portions 210 of the via electrodes 200 from being deformed or broken during a grinding process that is performed to expose the back-side end portions 210 of the via electrodes 200.

Figure 5:
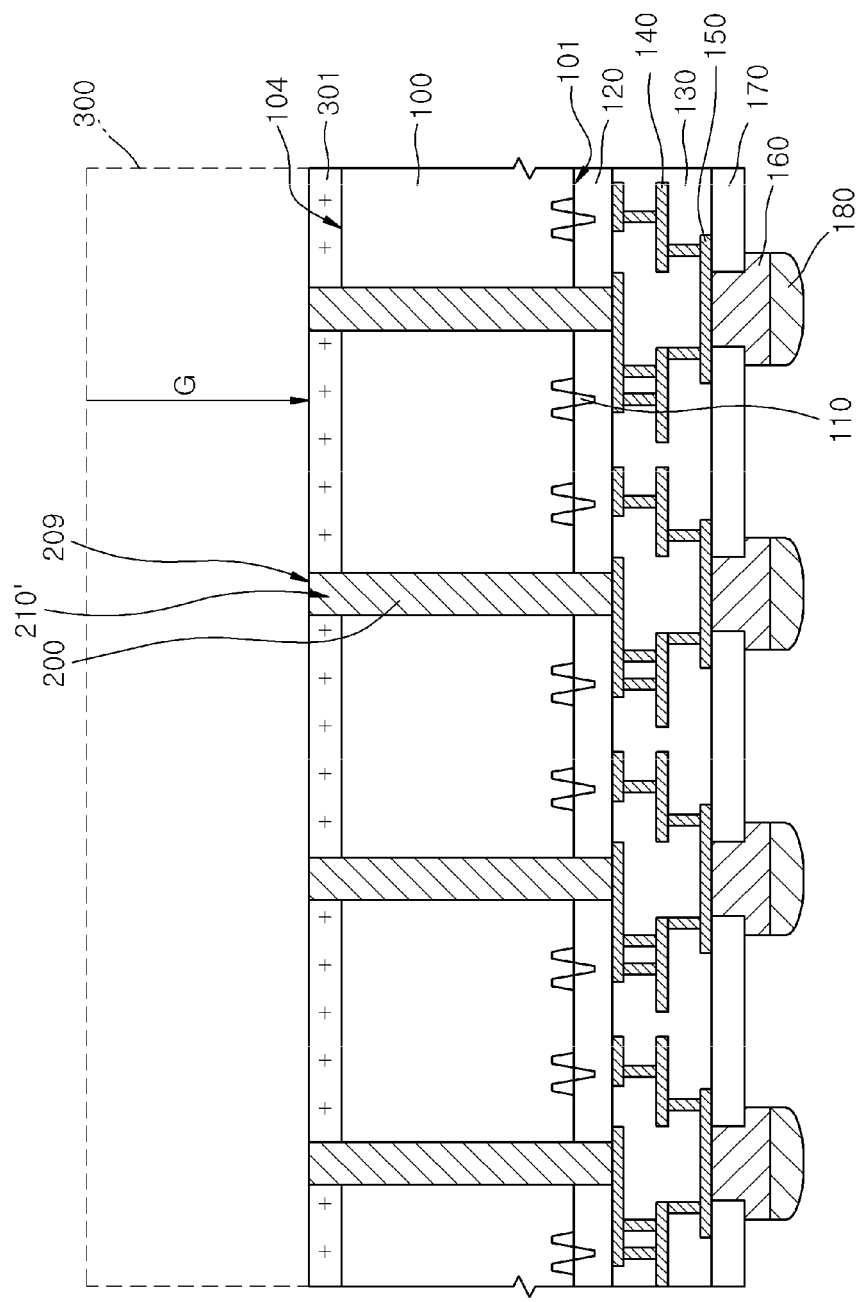

Referring to FIG. 5, the initial back-side molding layer 300 and the back-side end portions 210 are ground to form a back-side molding layer 301 that exposes top surfaces 209 of ground back-side end portions 210' of the via electrodes 200. The grinding process is indicated by "G" in FIG. 5. After the initial back-side molding layer 300 is ground in the grinding process G, a top surface of the back-side molding layer 301 may be substantially flat. The back-side end portions 210 of the via electrodes 200 are partially removed during the back grinding process G. As a result, the via electrodes 200 have substantially the same length after the back grinding process G is performed.

As described above, since the initial back-side molding layer 300 may be formed of the EMC material, the initial back-side molding layer 300 may prevent the top surfaces of the back-side end portions 210' of the via electrodes 200 from being deformed or broken during the back grinding process G. In an embodiment, the initial back-side molding layer 300 and the back-side end portions 210 may be planarized using a chemical mechanical polishing (CMP) process instead of the grinding process G.

After performing the grinding process G, second conductive bumps (360 of FIG. 1) may be formed on each of the ground back-side end portions 210' of the via electrodes 200.

After the via electrodes 200 penetrating the semiconductor substrate 100 are formed at a wafer level, the semiconductor substrate 100 may be separated into a plurality of semiconductor chips using a die sawing process. Then, at least two semiconductor chips may be stacked to form a stack package. Alternatively, after the via electrodes 200 penetrating the semiconductor substrate 100 are formed at a wafer level, a plurality of semiconductor substrates 100 may be stacked at a wafer level, and then the plurality of stacked semiconductor substrates 100 may be cut using a die sawing process to form a plurality of stack packages. As a result, semiconductor devices are formed as stack packages.

Figure 6:
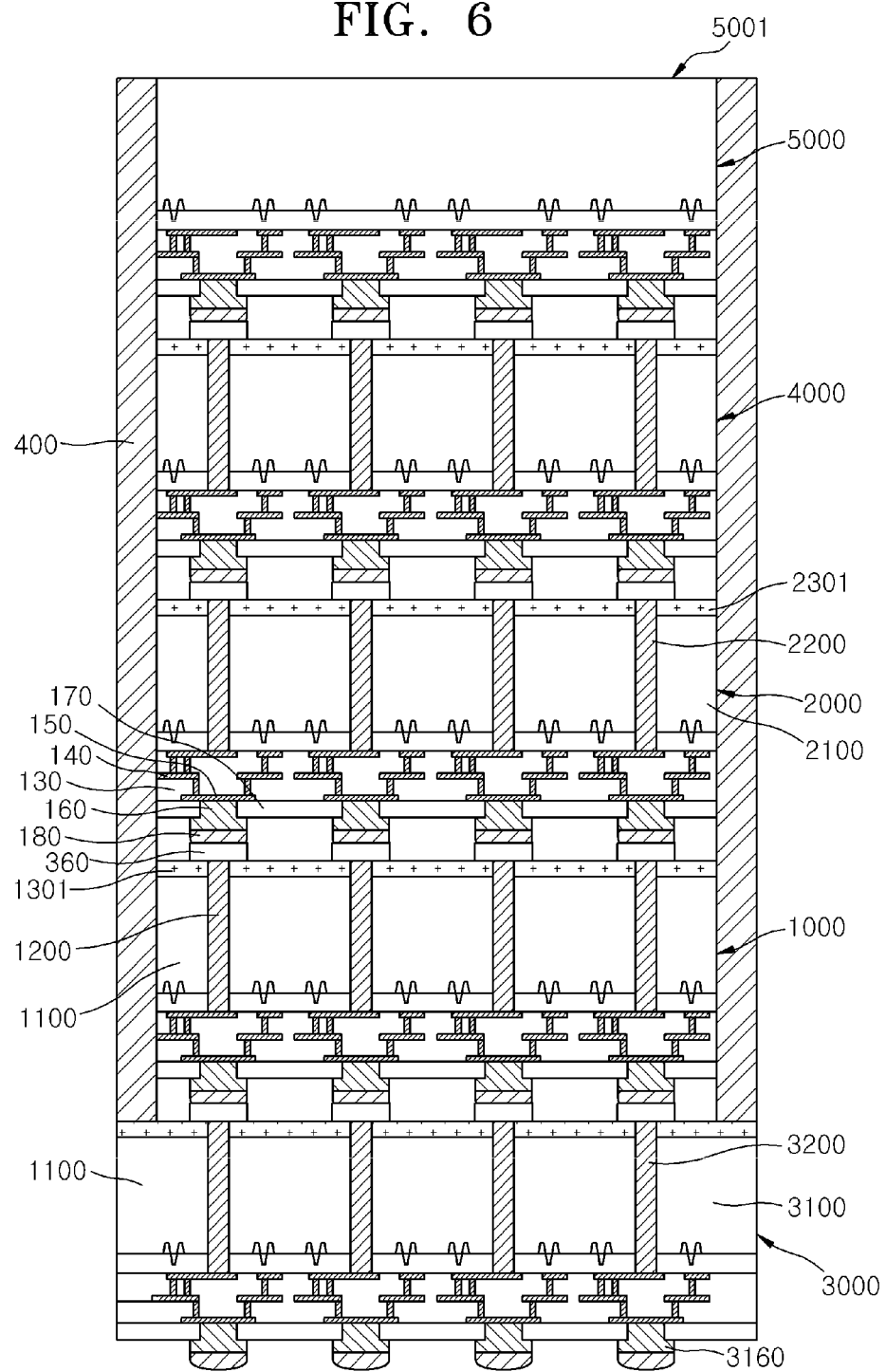
FIG. 6 is a cross-sectional view illustrating a semiconductor device according to another embodiment of the present invention.

FIG. 6 is a cross-sectional view illustrating a semiconductor device according to another embodiment of the present invention.

Referring to FIG. 6, the semiconductor device has a stack package form in which a plurality of semiconductor chips 1000, 2000, 3000, 4000, and 5000 is stacked. An underfill layer (or an insulating layer or an adhesive layer) may be interposed between the stacked chips. At least one of the semiconductor chips 1000, 2000, 3000, 4000, and 5000 includes a semiconductor substrate 100 and via electrodes 200 penetrating the semiconductor substrate 100. In FIG. 6, the same reference numerals as used in FIGS. 1 to 5 are used to denote the same elements as in FIGS. 1 to 5.

The semiconductor device includes the first semiconductor chip 1000, the second semiconductor chip 2000 stacked on the first semiconductor chip 1000, and a package molding layer 400 covering sidewalls of the first and second semiconductor chips 1000 and 2000. The package molding layer 400 may act as a protective layer. In an embodiment, the first and second semiconductor chips 1000 and 2000 are configured to have the same integrated circuit that executes substantially the same function. In another embodiment, the first and second semiconductor chips 1000 and 2000 are configured to have different integrated circuits that execute different functions.

The first semiconductor chip 1000 includes a first semiconductor substrate 1100, a plurality of first via electrodes 1200 penetrating the first semiconductor substrate 1100, and a first back-side molding layer 1301 covering a back-side surface of the first semiconductor substrate 1100 and surrounding external surfaces of sidewalls of back-side end portions of the first via electrodes 1200. The first back-side molding layer 1301 may be formed to expose top surfaces of the back-side end portions of the first via electrodes 1200. The first back-side molding layer 1301 may be formed by molding an epoxy molding compound (EMC) material.

The second semiconductor chip 2000 may have substantially the same configuration as the first semiconductor chip 1000. That is, the second semiconductor chip 2000 includes a second semiconductor substrate 2100, a plurality of second via electrodes 2200 penetrating the second semiconductor substrate 2100, and a second back-side molding layer 2301 covering a back-side surface of the second semiconductor substrate 2100 and surrounding external surfaces of sidewalls of back-side end portions of the second via electrodes 2200. The second back-side molding layer 2301 may be formed to expose top surfaces of the back-side end portions of the second via electrodes 2200. The second back-side molding layer 2301 may be formed by molding the EMC material. The second semiconductor chip 2000 is stacked on the first semiconductor chip 1000 such that the second via electrodes 2200 are electrically coupled to the first via electrodes 1200.

The package molding layer 400 may function as a protective layer that protects the first and second semiconductor chips 1000 and 2000. The package molding layer 400 may be formed of substantially the same material as the first and second back-side molding layers 1301 and 2301. The package molding layer 400 may be formed by molding the EMC material. Since the package molding layer 400, the first back-side molding layer 1301, and the second back-side molding layer 2301 are formed of substantially the same material, adhesion between the package molding layer 400 and the first and second back-side molding layers 1301 and 2301 may be improved.

The package molding layer may be attached to only sidewalls of a stacked structure including the first and second semiconductor substrates to constitute a conventional stacked package having a fan-out package form. In such a case, because the package molding layer is attached to only the sidewalls of the stacked structure, an adhesive strength between the stacked structure and the package molding layer may be degraded.

However, according to an embodiment, the first back-side molding layer 1301 formed of the same material as the package molding layer 400 is disposed between the first and second semiconductor chips 1000 and 2000. In addition, a back-side surface of the second semiconductor chip 2000 is covered with the second back-side molding layer 2301 formed of the same material as the package molding layer 400. Thus, the first and second back-side molding layers 1301 and 2301 may be strongly combined with the package molding layer 400 to prevent the package molding layer 400 from being delaminated from the sidewalls of the stacked structure.

The third semiconductor chip 3000 may be additionally disposed on a front-side surface of the first semiconductor chip 1000. That is, the third semiconductor chip 3000 is disposed opposite to the second semiconductor chip 2000 with respect to the first semiconductor chip 1000. The third semiconductor chip 3000 includes a third semiconductor substrate 3100 and a plurality of third via electrodes 3200 penetrating the third semiconductor substrate 3100. The third via electrodes 3200 are electrically coupled to the first via electrodes 1200.

Third conductive bumps 3160 are disposed on a front-side surface of the third semiconductor substrate 3100 that is opposite to the first semiconductor chip 1000. The third conductive bumps 3160 act as outer connection terminals that electrically couple the stacked package to another substrate or a mother board.

The third semiconductor chip 3000 may have a greater width than the first semiconductor chip 1000. Since the third semiconductor chip 3000 is wider than the first semiconductor chip 1000, when the first semiconductor chip 1000 is mounted on a back-side surface of the third semiconductor chip 3000, edges of the third semiconductor chip 3000 may laterally extend beyond the sidewalls of the first semiconductor chip 1000. The package molding layer 400 on the sidewalls of the first semiconductor chip 1000 may be flush with the edges of the third semiconductor chip 3000. That is, the package molding layer 400 may be molded such that outer sidewall surfaces of the package molding layer 400 are vertically aligned with sidewall surfaces of the third semiconductor chip 3000. In an embodiment, the third semiconductor chip 3000 may be replaced with an interposer, a printed circuit board (PCB), or a dummy substrate, which provides only electrical interconnection without any functions of a semiconductor chip.

The fourth semiconductor chip 4000 having substantially the same configuration as the second semiconductor chip 2000 may be additionally stacked on a back-side surface of the second semiconductor chip 2000. Furthermore, the fifth semiconductor chip 5000 may be stacked on the fourth semiconductor chip 4000. The fifth semiconductor chip 5000 may have substantially the same function as the first or second semiconductor chip 1000 or 2000. Alternatively, the fifth semiconductor chip 5000 may have a different function from the first and second semiconductor chips 1000 and 2000.

In an embodiment, the fifth semiconductor chip 5000 corresponding to a topmost semiconductor chip may not include the via electrodes as illustrated in FIG. 6. In another embodiment, the fifth semiconductor chip 5000 may include via electrodes that are substantially the same as those of the first or second semiconductor chip 1000 or 2000. The package molding layer 400 may extend to cover and protect sidewalls of the fourth and fifth semiconductor chips 4000 and 5000. A top surface 5001 of the fifth semiconductor chip 5000 that is on an opposite side to a side attached to the fourth semiconductor chip 4000 may be exposed to enhance heat radiation efficiency of the stacked package.

Figure 7:
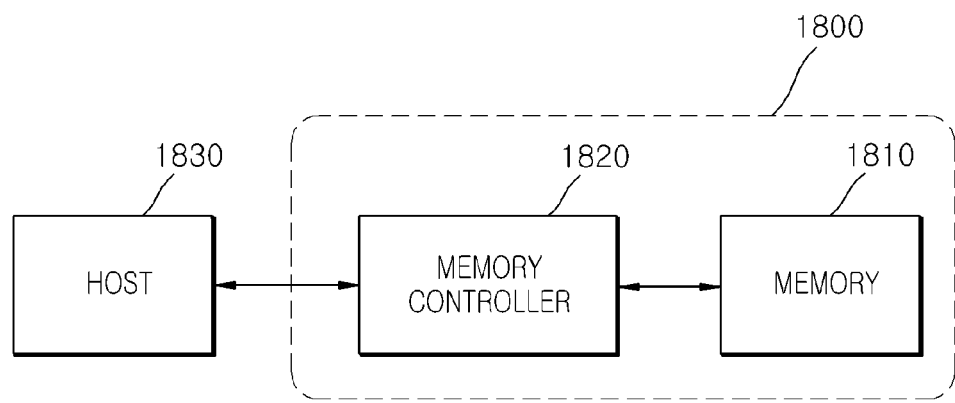
FIG. 7 is a block diagram illustrating an electronic system including a semiconductor device according to an embodiment of the present invention.

FIG. 7 is a block diagram illustrating an electronic system including a semiconductor device according to an embodiment of the present invention. The semiconductor device is provided in the form of a memory card 1800. The memory card 1800 includes a memory 1810 and a memory controller 1820.

The memory 1810 may include at least one of nonvolatile memory devices to which the packaging technology according to an embodiment of the present invention is applied. The memory controller 1820 may control operations for storing data in the memory 1810 and reading out data stored in the memory 1810 in response to a read/write request from a host 1830.

Figure 8:
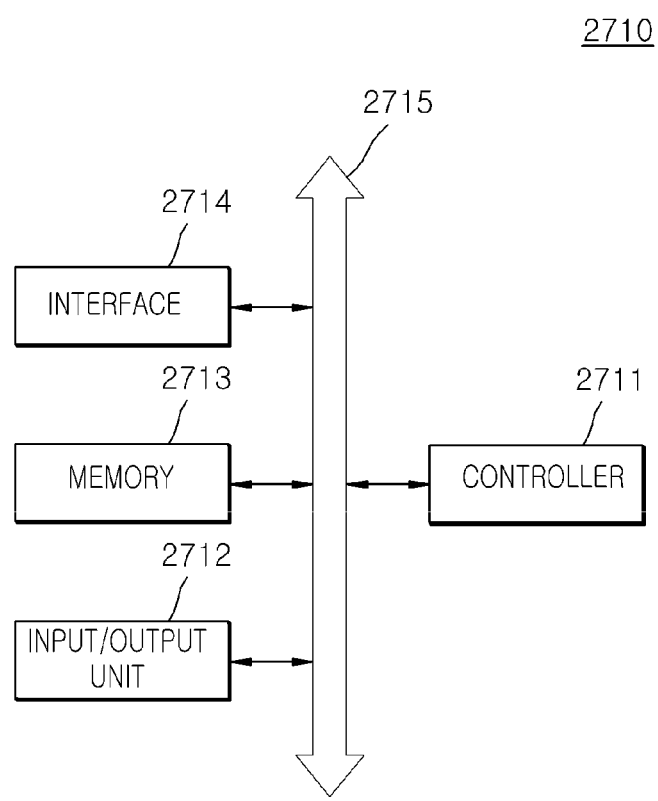
FIG. 8 is a block diagram illustrating another electronic system including a semiconductor device according to an embodiment of the present invention.

FIG. 8 is a block diagram illustrating another electronic system including a semiconductor device according to an embodiment of the present invention. The electronic system 2710 includes a controller 2711, an input/output unit 2712, and a memory 2713. The controller 2711, the input/output unit 2712, and the memory 2713 are coupled with one another through a bus 2715 providing a path through which data moves.

The controller 2711 may include at least one of at least one microprocessor, at least one digital signal processor, at least one microcontroller, and logic devices capable of performing the same functions as these components. The controller 2711 or the memory 2713 may include at least one semiconductor device according to an embodiment of the present invention. The input/output unit 2712 may include at least one of a keypad, a keyboard, a display device, a touch screen, and so forth.

The memory 2713 may store data and/or commands to be executed by the controller 2711. The memory 2713 may include a volatile memory device such as a DRAM and/or a nonvolatile memory device such as a flash memory. The flash memory may be mounted to an information processing system such as a mobile terminal or a desk top computer. The flash memory may constitute a solid state disk (SSD). In this case, the electronic system 2710 may stably store a large amount of data in a flash memory system.

The electronic system 2710 may further include an interface 2714 configured to transmit and receive data to and from a communication network. The interface 2714 may have a wired or wireless configuration. The interface 2714 may include an antenna or a wired or wireless transceiver.

The electronic system 2710 may be realized as a mobile system, a personal computer, an industrial computer or a logic system performing various functions. The mobile system may be any one of a personal digital assistant (PDA), a portable computer, a tablet computer, a mobile phone, a smart phone, a wireless phone, a laptop computer, a memory card, a digital music system, and an information transmission/reception system.

When the electronic system 2710 is used as equipment capable of performing wireless communication, the electronic system 2710 may be used in a communication system such as one of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), and Wibro (wireless broadband Internet).

Embodiments of the present invention have been disclosed above for illustrative purposes. Those skilled in the art will appreciate that various modifications, additions and substitutions are possible, without departing from the scope and spirit of the present invention as disclosed in the accompanying claims.

What is claimed is:

1. A semiconductor device comprising:
   a first substrate;
   a first via electrode penetrating the first substrate and including a back-side end portion that protrudes from a back-side surface of the first substrate;
   a first back-side molding layer covering the back-side surface of the first substrate and surrounding surfaces of a sidewall of the back-side end portion of the first via electrode;
   a second substrate stacked over the first substrate and electrically coupled to the first via electrode; and
   a package molding layer covering sidewalls of the first and second substrates and a sidewall of the first back-side molding layer,
   wherein the package molding layer is formed of a material that is substantially the same as a material of the first back-side molding layer.

2. The semiconductor device of claim 1, wherein the package molding layer covers the sidewalls of the first and second substrates so that a back-side surface of the second substrate is exposed, and
   wherein a front-side surface of the second substrate faces the back-side surface of the first substrate.

3. The semiconductor device of claim 1, wherein the package molding layer and the first back-side molding layer are formed of an epoxy molding compound material.

4. The semiconductor device of claim 1, further comprising:
   a second via electrode penetrating the second substrate and electrically coupled to the first via electrode, the second via electrode including a back-side end portion that protrudes from a back-side surface of the second substrate; and
   a second back-side molding layer covering the back-side surface of the second substrate and surrounding a surface of a sidewall of the back-side end portion of the second via electrode,
   wherein the package molding layer covers a sidewall of the second back-side molding layer.

5. The semiconductor device of claim 1, further comprising:
   a third substrate disposed under the first substrate;
   a third via electrode penetrating the third substrate and electrically coupled to the first via electrode, the third via electrode including a back-side end portion that protrudes from a back-side surface of the third substrate;
   a third back-side molding layer covering the back-side surface of the third substrate and surrounding a surface of a sidewall of the back-side end portion of the third via electrode;
   an outer connection terminal attached to a front-side surface of the third substrate and electrically coupled to the third via electrode; and
   a package molding layer covering sidewalls of the first substrate and the first back-side molding layer and contacting an outer part of a top surface of the third back-side molding layer.

6. The semiconductor device of claim 1, further comprising an interposer or a printed circuit board over which the first substrate is stacked,
   wherein the interposer or the printed circuit board has a greater width than a width of the first substrate.

7. A semiconductor device comprising:
   a plurality of vertically stacked chips,
   wherein the plurality of vertically stacked chips comprises:
   a first chip including a first substrate, a first via electrode penetrating the first substrate, and a first back-side molding layer covering a back-side surface of the first substrate and surrounding a surface of a sidewall of a first back-side end portion of the first via electrode, the first back-side end portion protruding from the back-side surface of the first substrate;
   a second chip including a second substrate, a second via electrode penetrating the second substrate, and a second back-side molding layer covering a back-side surface of the second substrate and surrounding a surface of a sidewall of a second back-side end portion of the second via electrode, the second back-side end portion protruding from the back-side surface of the second substrate; and
   a package molding layer covering sidewalls of the first and second chips and sidewalls of the first and second back-side molding layers,
   wherein the second chip is stacked over the first chip such that the second via electrode is electrically coupled to the first via electrode, and
   wherein the package molding layer is formed of a material that is substantially the same as a material of the first and second back-side molding layers.

8. The semiconductor device of claim 7, wherein the package molding layer and the first and second back-side molding layers are formed with an epoxy molding compound material.

9. The semiconductor device of claim 7, wherein the plurality of chips further comprises a third chip under which the first chip is stacked,
   wherein the third chip has a greater width than the first chip.

10. The semiconductor device of claim 9, wherein the third chip includes a third substrate, a third via electrode penetrating the third substrate, and a third back-side molding layer covering a back-side surface of the third substrate and surrounding a surface of a sidewall of a third back-side end portion of the third via electrode, the third back-side end portion protruding from the back-side surface of the third substrate.

11. The semiconductor device of claim 7, further comprising an interposer or a printed circuit board over which the first chip is stacked,
   wherein the interposer or the printed circuit board has a greater width than the first chip.

* * * * *